United States Patent
Park

(10) Patent No.: US 8,119,436 B2
(45) Date of Patent: Feb. 21, 2012

(54) IMAGE SENSOR HAVING OPTICAL WAVEGUIDE STRUCTURE AND METHOD FOR MANUFACTURING THE SAME

(75) Inventor: Seung Ryong Park, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/608,496

(22) Filed: Oct. 29, 2009

(65) Prior Publication Data

US 2010/0109112 A1 May 6, 2010

(30) Foreign Application Priority Data

Nov. 5, 2008 (KR) .................. 10-2008-0109552

(51) Int. Cl.
*H01L 31/0232* (2006.01)

(52) U.S. Cl. .............. 438/69; 438/60; 438/75; 438/144; 257/432; 257/184; 257/187; 257/259; 257/292; 257/461; 257/E31.127; 257/E27.163; 257/E27.015; 257/E29.065; 257/E27.082; 257/E27.083

(58) Field of Classification Search .................. 257/432, 257/E21.001, E31.127, E21.185, E21.189, 257/E27.082, E27.083, E29.065; 438/69, 438/70, 75, 144
See application file for complete search history.

(56) References Cited

U.S. PATENT DOCUMENTS

| 2008/0296713 A1* | 12/2008 | Lee et al. ................ 257/432 |
| 2009/0008730 A1* | 1/2009 | Roy et al. ................ 257/432 |
| 2009/0020838 A1* | 1/2009 | Lin et al. ................ 257/432 |

FOREIGN PATENT DOCUMENTS

KR 10-2005-0085579 A 8/2005

* cited by examiner

*Primary Examiner* — Marc Armand
(74) *Attorney, Agent, or Firm* — Saliwanchik, Lloyd & Eisenschenk

(57) ABSTRACT

An image sensor and a method for manufacturing the same are disclosed. The image sensor can include a semiconductor substrate that includes photodiodes arranged for each unit pixel; an interlayer dielectric layer and metal wirings disposed on the semiconductor substrate; and a photorefractive unit that is formed on the periphery of an optical path incident on the photodiodes. The photorefractive unit has a lower refractive index than the interlayer dielectric layer. The slantly incident light can be incident on the photodiodes, while maintaining the slanted optical path as it is. The light sensitivity of the photodiodes can be improved, thereby improving image quality.

9 Claims, 3 Drawing Sheets

IMAGE SENSOR HAVING OPTICAL WAVEGUIDE STRUCTURE AND METHOD FOR MANUFACTURING THE SAME

CROSS-REFERENCE TO RELATED APPLICATION

This application claims the benefit under 35 U.S.C. §119 of Korean Patent Application No. 10-2008-0109552, filed Nov. 5, 2008, which is hereby incorporated by reference in its entirety.

BACKGROUND

An image sensor is a semiconductor device that converts an optical image into an electrical signal, and it largely includes a charge coupled device (CCD) image sensor and a complementary metal oxide semiconductor (CMOS) image sensor.

The CMOS image sensor forms a photodiode and a MOS transistor within a unit pixel to sequentially detect electrical signals of each unit pixel in a switching scheme, implementing an image.

As a design rule is gradually decreased in the CMOS image sensor, the size of the unit pixel is decreased so that light sensitivity may be decreased. In order to improve such a light sensitivity, a microlens is formed on a color filter.

However, owing to an additional structure such as a dielectric layer and a metal wiring existing in an optical path from the microlens to a photodiode, the light sensitivity may be decreased by the diffraction and scattering of light.

The diffraction and scattering of light as mentioned above may cause a problem of degradation of image quality such as a cross talk in the image sensor.

In order to address this problem, the related art has attempted to improve the sensitivity of the image sensor by forming an optical waveguide on the dielectric layer in the pixel region of the image sensor.

However, although light is vertically incident on the central portion of the image sensor, light is actually incident on a cell at the edge portion of the image sensor with a slant of about 20 degrees. Therefore, the structure of a general optical waveguide, which typically has a vertical shape, may not perform properly in waveguiding the slanted light incident on the outer portion.

BRIEF SUMMARY

An embodiment of the present invention provides an image sensor that can improve the light sensitivity of a photodiode and a method for manufacturing the same.

An embodiment of the present invention provides an image sensor that has an optical waveguide structure that can uniformly sense light for cells in the central portion and the outer portion of the image sensor, and a method for manufacturing the same.

An embodiment can provide a doping-type optical waveguide that can waveguide light that is slantly incident on the outer portion of the image sensor.

An embodiment can provide an image sensor that forms a photorefractive unit on the periphery of the optical waveguide path to allow the light refracted by the photorefractive unit to be incident on the respective photodiodes, and forms the photorefractive unit simultaneously with the process of forming the metal wiring.

An image sensor according to one embodiment includes: a semiconductor substrate that includes photodiodes arranged for each unit pixel; an interlayer dielectric layer that includes metal wirings disposed on the semiconductor substrate; and a photorefractive unit that is formed on the periphery of an optical path incident on the photodiodes, the photo refractive unit having a lower refractive index than the interlayer dielectric layer.

A method for manufacturing an image sensor according to another embodiment includes: forming photodiodes for each pixel on a semiconductor substrate; forming an interlayer dielectric layer on the semiconductor substrate; forming metal wirings and doping patterns on the periphery of the metal wirings within the interlayer dielectric layer; and expanding the doping patterns to the interlayer dielectric layer by performing an annealing process to form a photorefractive unit, the photorefractive unit having a lower refractive index than the interlayer dielectric layer.

DETAILED DESCRIPTION

Figure 1:
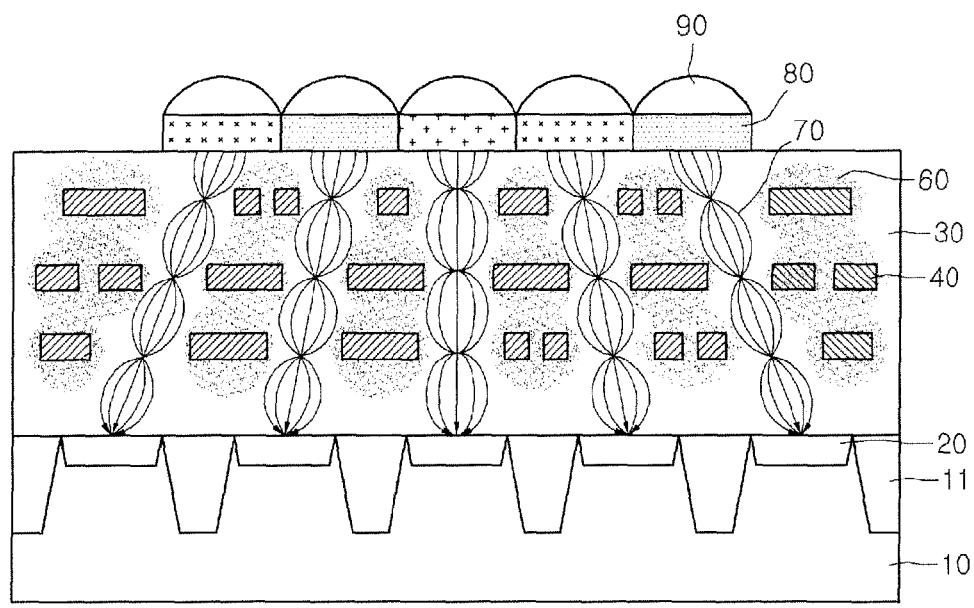
FIG. 1 is a cross-sectional view of an image sensor according to an embodiment.

Embodiments of an image sensor and a method for manufacturing the same will be described in detail with reference to the accompanying drawings.

In the description of an embodiment, when an element is referred to as being "on/under" another element, it can be directly on/under the another element or be indirectly on/under the another element with one or more intervening elements interposed therebetween.

In the drawings, the thickness or size of each layer may be exaggerated, omitted or schematically illustrated for the convenience and clarity of explanation. Also, the size of each constituent may not completely reflect its actual size.

FIG. 1 is a cross-sectional view of an image sensor according to an embodiment.

Referring to FIG. 1, a device isolation layer 11 that defines an active region and a field region is formed on a semiconductor substrate 10. And, a unit pixel formed in the active region includes a photodiode 20 that receives light to generate a photocharge and a CMOS circuit (not shown) that is connected to the photodiode 20 to convert the received photocharge into an electrical signal.

After the relevant devices including the unit pixel are formed, a metal wiring 40 and an interlayer dielectric layer 30 are formed on the semiconductor substrate 10.

The interlayer dielectric layer 30 may be formed having plural layers. For example, the interlayer dielectric layer 30 may be formed of a nitride layer or an oxide layer and may be formed in a plurality of layers.

The metal wiring 40 may be formed in plural, penetrating through the interlayer dielectric layer 30. The metal wiring 40 is intentionally laid-out to avoid blocking light incident on the photodiode 20.

According to an embodiment of the present invention, the metal wiring 40 is disposed on the position other than an optical path 70 where light is incident on the photodiode 20. Therefore, since light is vertically incident on the semiconductor substrate 10 for the pixels at the central portion of the substrate, the metal wiring 40 for the central pixels is laid-out not to be formed on the portion vertically corresponding to the photodiode 20. Since light is slantly incident for the pixels at the outer portion of the substrate 10, the metal wiring 40 for the outer pixels can be laid-out to be formed on the portion vertically corresponding to the photodiode 20 so long as the metal wiring is not formed on the slanted optical path 70.

A photorefractive unit 60 is formed on the periphery of the metal wiring 40. The refractive index of the photorefractive unit 60 is formed to be lower than the refractive index of the interlayer dielectric layer 30.

The photorefractive unit 60 may be formed by doping impurity into the interlayer dielectric layer 30.

The light incident on the photodiode 20 is refracted toward the side having a high refractive index. Therefore, because the photorefractive unit 60 has a lower refractive index than the interlayer dielectric layer 30, the light is incident on the photodiode 20 through an optical waveguide formed by the photorefractive unit 60.

Accordingly, light loss due to the diffraction and scattering of light by the metal wiring 40 can be reduced, and the slanted light incident on the outer portion is also efficiently waveguided through the optical path 70 induced by the photorefractive unit 60 so that the light can be incident on the photodiode 20.

The photorefractive unit 60 may include at least one of zinc oxide ZnO ions and titanium Ti ions.

The photorefractive unit 60 is designed not to be formed on the optical path 70 that is incident on each photodiode 20.

The interlayer dielectric layer 30 may include a passivation layer. The passivation layer can be used to protect a device from moisture and scratch. The passivation layer may be formed of a dielectric layer. For example, the passivation layer may be formed of any one of silicon nitride layer and a silicon oxynitride layer, or may be formed in a structure where one or more layers are stacked.

A color filter array 80 is formed on the semiconductor substrate 10 including the interlayer dielectric layer 30. The color filter array 80 can be formed of a dyed photoresist. One color filter is formed for each unit pixel to separate colors from the incident light.

Such a color filter array 80 includes a first color filter, a second color filter, and a third color filter. For example, the first color filter may be a red color filter, the second color filter may be a green color filter, and the third color filter may be a blue color filter.

Although not shown, a planarization layer may be formed on the color filter array 80 to remove a step difference in the heights of the color filters of the color filter array 80. When including a planarization layer, a microlens to be formed through a subsequent process would be formed on the planarized surface.

A microlens 90 can be formed on the color filter array 80.

FIGS. 2 to 6 are cross-sectional views showing manufacturing processes of an image sensor according an embodiment.

Herein, portions of the metal wiring 40 and the interlayer dielectric layer 30 in the image sensor of FIG. 1 are enlarged. The method for manufacturing the photorefractive unit 60 according to an embodiment of the present invention will be described in detail, and the processes for the CMOS circuit (not shown), the photodiode 20, the color filter array 80, and the microlens 90 may be manufactured according to a general process method such as any suitable methods known in the art.

In accordance with embodiments, a doping pattern for forming the photorefractive unit 60 may be formed on the upper layer, on the lower layer, or on the upper and lower layers of the metal wiring, and the doping pattern may also be independently formed on the interlayer dielectric layer.

Figure 2:
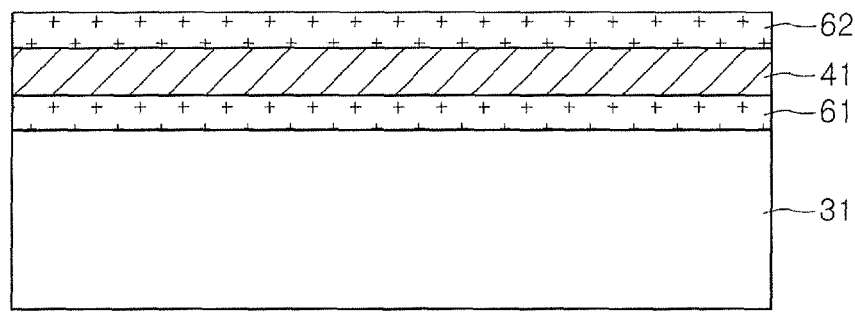
FIGS. 2 to 6 are cross-sectional views showing manufacturing processes of an image sensor according an embodiment.

Referring to FIG. 2, a first doping layer 61 can be formed on a first interlayer dielectric layer 31 of the interlayer dielectric layer 30. A metal layer 41 of the metal wiring 40 can be formed on the first doping layer 61. In addition, a second doping layer 62 can be formed on the metal layer 41.

The first interlayer dielectric layer 31 may be an oxide layer.

For example, the interlayer dielectric layer can include a fluorinated-silicate-glass (FSG) layer formed through a plasma enhanced chemical vapor deposition (PECVD) method. Alternatively, or in addition, the interlayer dielectric layer can include tetraethyl orthosilicate (TEOS), undoped silicate glass (USG), or boro-phospho-silicate glass (BPSG).

The first and second doping layers 61 and 62 may be a ZnO layer or a Ti layer. The first and second doping layers 61 and 62 can be formed by a deposition process.

The first and second doping layers 61 and 62 can be used to expand doping ions to the peripheral interlayer dielectric layer to form the photorefractive unit on the interlayer dielectric layer. The photorefractive unit has a lower refractive index than the refractive index of the interlayer dielectric layer to refract the incident light towards the interlayer dielectric layer having a relatively higher refractive index, making it possible to waveguide light.

Therefore, any material may be used for the first and second doping layers 61 and 62, so far as the layer includes impurity that can lower the refractive index of the interlayer dielectric layer.

The first and second doping layers 61 and 62 may be formed at a thickness of 10 Å to the thickness of a metal layer.

The metal layer 41 may be formed at a thickness of 1000 to 6000 Å.

Figure 3:
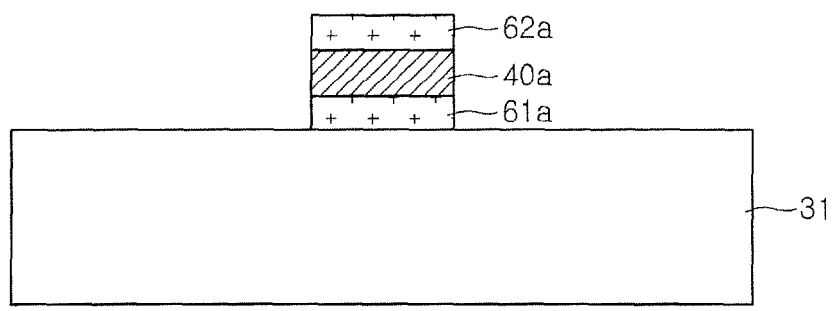

Referring to FIG. 3, a first doping pattern 61*a*, a first metal wiring 40*a*, and a second doping pattern 62*a* may be formed by patterning the first doping layer 61, the metal layer 41, and the second doping layer 62.

The first doping pattern 61*a* and the second doping pattern 62*a* may have the same shape as the first metal wiring 40*a* that is patterned therewith.

More specifically according to one embodiment, a photoresist film is coated over the second doping layer 62 and then the photoresist layer is baked. Thereafter, the photoresist layer is selectively exposed and then is developed, forming a photoresist pattern over the second doping layer 62. The second doping layer 62, the metal layer 41, and the first doping layer 61 are etched using the photoresist pattern as a mask. Thereafter, the photoresist pattern is removed.

Figure 4:
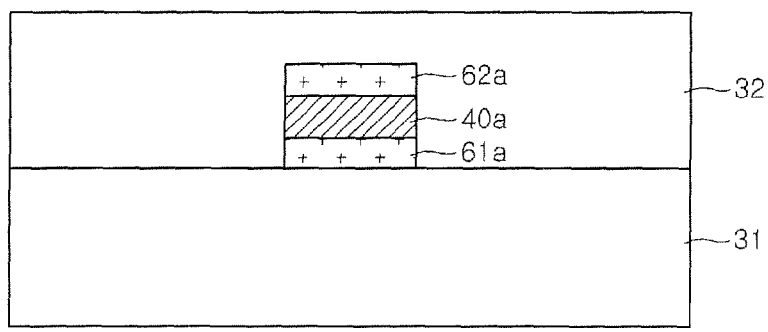

Referring to FIG. 4, a second interlayer dielectric layer 32 of the interlayer dielectric layer 30 is formed over the first interlayer dielectric layer 31 on which the first doping pattern 61*a*, the first metal wiring 40*a*, and the second doping layer 62*a* are formed.

At this time, the second interlayer dielectric layer 32 may be formed to be thick due to the high height of the stack of the first doping pattern 61*a*, the first metal wiring 40*a*, and the second doping pattern 62*a*.

Then, a planarization process may be performed to remove a curve that may be formed on the upper surface of the second interlayer dielectric layer 32.

Figure 5:
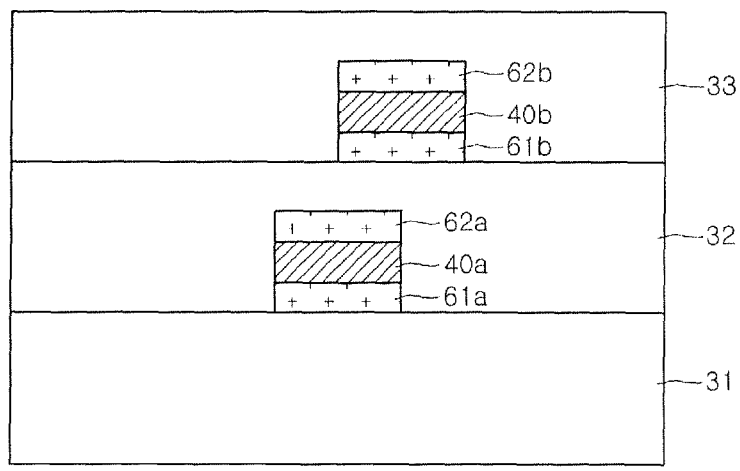

Thereafter, referring to FIG. 5, a third doping pattern 61*b*, a second metal wiring 40*b*, and a fourth doping pattern 62*b* can be formed on the second interlayer dielectric layer 32 by repeating the processes as shown in FIGS. 2 and 3.

The doping pattern is not always formed on the upper and lower portions of the metal layers of the metal wiring. Rather the doping pattern can be selectively formed when occasion demands.

A third interlayer dielectric layer 33 is formed over the second interlayer dielectric layer 32 on which the third doping pattern 61b, the second metal wiring 40b, and the fourth doping pattern 62b are formed. A planarization process can also be performed with respect to the third interlayer dielectric layer 33.

A metal wiring layer may be formed on the semiconductor substrate on which the photodiodes and the CMOS circuit are formed by repeating the processes as above.

The metal wirings of the metal wiring layer are laid-out intentionally not to hide light incident on the photodiodes 20 in consideration of the optical path.

Figure 6:
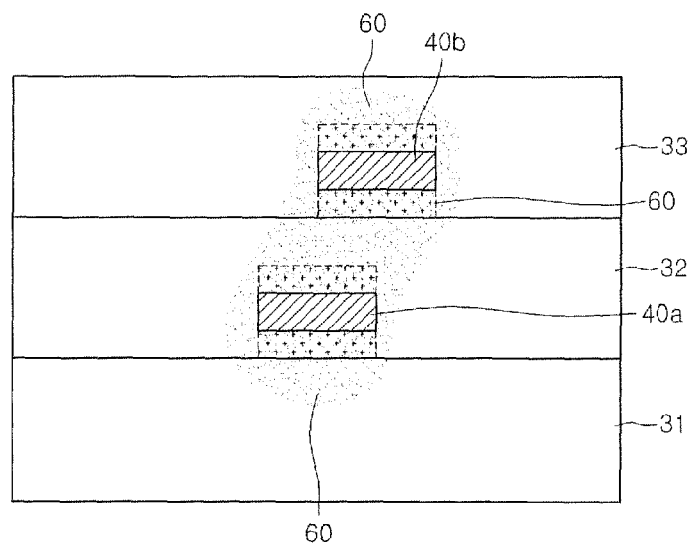

Thereafter, as shown in FIG. 6, an annealing process is performed on the semiconductor substrate 10 formed with the first and second metal wirings 40a and 40b, and the first to fourth doping patterns 61a, 61b, 62a, and 62b to allow impurities from the doping patterns 61a, 61b, 62a, and 62b to be expanded into the adjacent interlayer dielectric layers 31, 32, and 33.

Therefore, a photorefractive unit 60 is formed on the periphery of the first to fourth doping patterns 61a, 61b, 62a, and 62b.

The photorefractive unit 60 refracts and pushes the light induced towards the metal wiring to serve to inhibit the light loss due to the scattering and diffraction, and to induce the light in a desired direction.

For the incident light that is slantly incident, such as at an outer region of the image sensor, the photorefractive unit 60 is disposed so that the light can be incident on the photodiodes 20 while maintaining the slanted optical path. The slanted incident light incident on the outer portion of the pixel can be incident on the photodiodes 20, while maintaining an incident angle.

In other words, the optical path 70 between the photodiode 20 and the microlens 90 is slantly formed, and the metal wiring 40 and the photorefractive unit 60 are formed on the periphery of the optical path 70. The metal wiring 40 and the photorefractive unit 60 are preferably formed on the periphery along the optical path 70, and are formed on the interlayer dielectric layer 30 having at least two layers.

Figure 7:
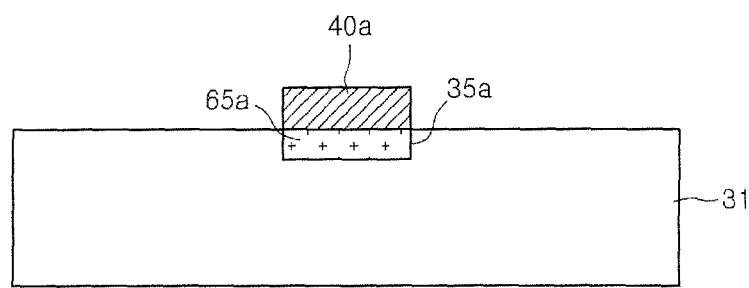
FIGS. 7 to 9 are cross-sectional views showing manufacturing processes of an image sensor according to an embodiment.
Figure 8:
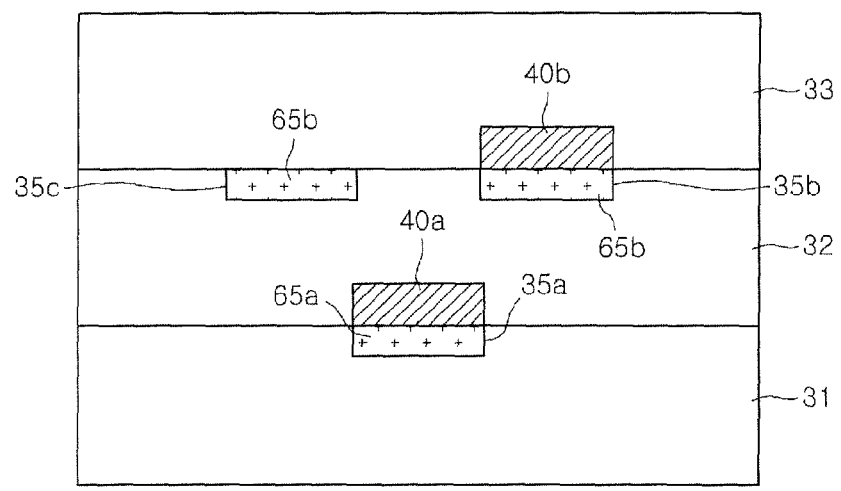
Figure 9:
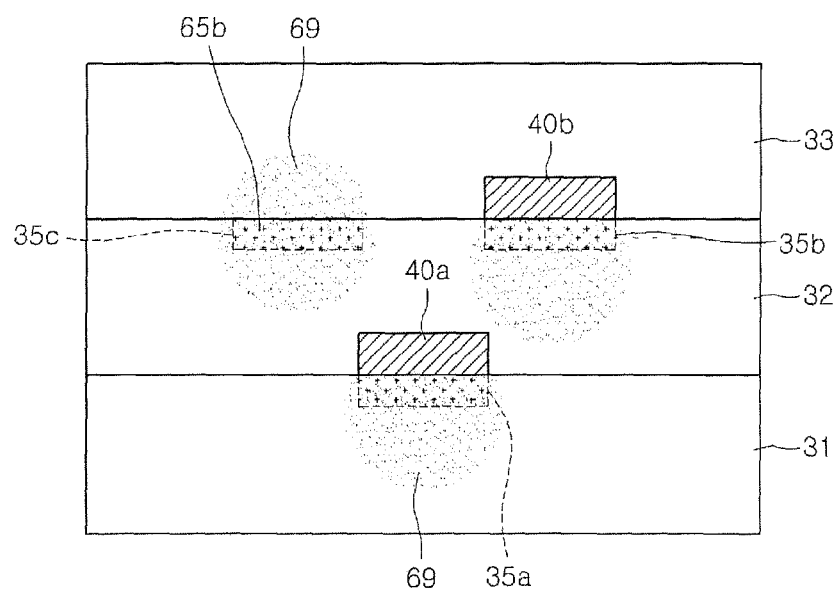

FIGS. 7 to 9 are cross-sectional views showing manufacturing processes of an image sensor according to another embodiment.

Herein, portions of the metal wiring and the interlayer dielectric layer in the image sensor of FIG. 1 are shown enlarged. The method for manufacturing the photorefractive unit according to an embodiment of the present invention will be described in detail, and the processes for the CMOS circuit (not shown), the photodiode, the color filter array, and the microlens may be manufactured according to a general process method such as any suitable methods known in the art.

In accordance with embodiments, a doping pattern for forming the photorefractive unit may be formed on the upper layer, on the lower layer, or on the upper and lower layers of the metal wiring, and the doping pattern may also be independently formed on the interlayer dielectric layer.

Referring to FIG. 7, a first trench 35a can be formed in a first interlayer dielectric layer 31. The first trench 35a is preferably formed around the position where the metal wirings are formed by avoiding the optical path.

A first doping layer is formed over a first interlayer dielectric layer 31 in which the first trench 35a is formed, and a first doping pattern 65a buried in the first trench 35a is formed by polishing the first doping layer.

The depth of the first trench 35a may be formed at a thickness of 10 Å to the thickness of the interlayer dielectric layer.

The interlayer dielectric layer may be formed at a thickness of 1000 to 10000 Å.

Thereafter, a metal layer is formed over the exposed first interlayer dielectric layer 31, including the first doping pattern 65a. The metal layer can then be patterned to form a first metal wiring 40a.

Although the first metal wiring 40a may be formed on the position corresponding to the first doping pattern 65a, it is not limited thereto, so long as it is disposed on a position not to hide the light incident on the photodiode 20.

In a further embodiment, another doping layer (not shown) can be formed on the metal layer. In one of such further embodiments, the metal layer and the other doping layer can be patterned together, thereby making it also possible to form a metal wiring and a top doping pattern of the other doping layer.

The first interlayer dielectric layer 31 may be an oxide layer.

For example, the interlayer dielectric layer can include FSG, TEOS, USG, or BPSG.

The first doping pattern 65a may be a ZnO layer or a Ti layer.

As shown in FIG. 8, a second interlayer dielectric layer 32 is formed over the first interlayer dielectric layer 31 on which the first metal wiring 40a is formed.

Second and third trenches 35b and 35c may be formed in the second interlayer dielectric layer 32. The second and third trenches 35b and 35c are for forming second doping patterns 65b.

A second doping layer can be formed over the second interlayer dielectric layer 32 in which the second and third trenches 35b are formed, and is polished until the second interlayer dielectric layer 32 is exposed. Accordingly, second doping patterns 65b buried in the second and third trenches 35b and 35c are formed.

Thereafter, a second metal wiring 40b is formed on the second interlayer dielectric layer 32 in which the second doping patterns 65b are formed.

In one embodiment, a metal layer is formed over the second interlayer dielectric layer 32, and the metal layer is patterned using a process such as a photolithography, thereby making it possible to form the second metal wiring 40b.

The second metal wiring 40b may also be formed on the second doping pattern 65b. The second metal wiring 40b can be formed on one of the second doping patterns 65b while not being formed on another of the second doping patterns 65b. For example, the second metal wiring 40b can be formed on the second doping pattern 65b in the second trench 35b, but not on the second doping pattern 65b in the third trench 35c.

A top doping pattern (not shown) may be formed on the metal wiring.

Thereafter, a third interlayer dielectric layer 33 is formed over the second interlayer dielectric layer 32.

The metal wirings are formed on the interlayer dielectric layers having plural layers, thereby forming a metal wiring layer.

At this time, the metal wirings are laid-out not to hide the light incident on the photodiode 20. In other words, the light incident on the photodiode 20 is vertically incident on the substrate in the central portion of the image sensor, and the light incident on the photodiode 20 is incident slantly to the substrate in the outer portion thereof. Therefore, the metal wirings are designed to be formed on the periphery of an optical path 70 in consideration of the optical path 70 (see FIG. 1).

Referring to FIG. 9, the semiconductor substrate 10 can be annealed after the metal wiring layer is formed such that the first and second doping patterns 65a and 65b formed in the interlayer dielectric layers 31, 32, and 33 can expand impurity to the peripheral interlayer dielectric layers 31, 32, and 33, thereby forming a photorefractive unit 69.

The photorefractive unit 69 formed by expanding doping ions to the interlayer dielectric layers 31, 32, and 33 has a lower refractive index than the refractive index of the peripheral dielectric layers 31, 32, and 33, making it possible to control the path of light incident on this portion.

The photorefractive unit 69 refracts and pushes away the light induced towards the metal wiring to serve to inhibit the light loss due to the scattering and diffraction, and to induce the light in a desired direction.

Therefore, the photorefractive unit 69 refracts lights strayed from the optical path 70 to be directed in the direction of the optical path to be incident on the photodiode 20, making it possible to reduce light loss and improve the sensitivity of the photodiode 20.

Because the incident light is slantly incident at an outer region of the image sensor, the photorefractive unit 60 is disposed so that the light can be incident on the photodiode 20 while maintaining the slanted optical path 70. In other words, the optical path 70 between the photodiode 20 and the microlens 90 is slanted, and the metal wiring 40 and the photorefractive unit 60 are formed on the periphery of the optical path 70 so that the light can be incident on the photodiode 20 along the slanted optical path 70.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing an image sensor, comprising:
    forming photodiodes for each unit pixel on a semiconductor substrate;
    forming an interlayer dielectric layer on the semiconductor substrates;
    forming metal wirings and doping patterns around the metal wirings in the interlayer dielectric layer; and
    expanding impurities from the doping patterns into the interlayer dielectric layer by performing an annealing process to form a photorefractive unit having a lower refractive index than the interlayer dielectric layer,
    wherein the photorefractive unit is disposed such that light slantly incident on the interlayer dielectric layer is converged into an optical waveguide by the photorefractive unit to be incident on the photodiodes.

2. The method for manufacturing the image sensor according to claim 1, wherein the forming of the metal wirings and the doping patterns around the metal wirings comprises:
    forming a first doping layer over a first interlayer dielectric layer of the interlayer dielectric layer;
    forming a metal layer over the first doping layer;
    forming a second doping layer over the metal layer; and
    patterning the first doping layer, the metal layer, and the second doping layer to form a first doping pattern of the doping patterns, a metal pattern of the metal wirings, and a second doping pattern of the doping patterns on the first interlayer dielectric layer.

3. The method for manufacturing the image sensor according to claim 1, wherein the forming of the metal wirings and the doping patterns around of the metal wirings comprises:
    forming a trench in a first interlayer dielectric layer of the interlayer dielectric layer;
    forming a doping layer over the interlayer dielectric layer including in the trench; and
    polishing the doping layer until the interlayer dielectric layer is exposed to form a first doping pattern of the doping patterns buried in the trench.

4. The method for manufacturing the image sensor according to claim 1, wherein the doping patterns are a ZnO layer or a Ti layer.

5. The method for manufacturing the image sensor according to claim 1, wherein the photorefractive unit comprises a region where ZnO ions or Ti ions are expanded to the interlayer dielectric layer.

6. The method for manufacturing the image sensor according to claim 1, further comprising, after the forming of the photorefractive unit:
    forming a microlens on the interlayer dielectric layer for each unit pixel.

7. The method for manufacturing the image sensor according to claim 1, wherein the metal wirings, the doping patterns and the photorefractive unit are disposed on the periphery of an optical path incident on the photodiodes.

8. A method for manufacturing an image sensor, comprising:
    forming photodiodes for each unit pixel on a semiconductor substrate;
    forming an interlayer dielectric layer on the semiconductor substrates;
    forming metal wirings and doping patterns around the metal wirings in the interlayer dielectric layer; and
    expanding impurities from the doping patterns into the interlayer dielectric layer by performing an annealing process to form a photorefractive unit having a lower refractive index than the interlayer dielectric layer,
    wherein the forming of the metal wirings and the doping patterns around the metal wirings comprises:
    forming a first doping layer over a first interlayer dielectric layer of the interlayer dielectric layer;
    forming a metal layer over the first doping layer;
    forming a second doping layer over the metal layer; and
    patterning the first doping layer, the metal layer, and the second doping layer to form a first doping pattern of the doping patterns, a metal pattern of the metal wirings, and a second doping pattern of the doping patterns on the first interlayer dielectric layer.

9. A method for manufacturing an image sensor, comprising:
    forming photodiodes for each unit pixel on a semiconductor substrate;
    forming an interlayer dielectric layer on the semiconductor substrates;
    forming metal wirings and doping patterns around the metal wirings in the interlayer dielectric layer; and
    expanding impurities from the doping patterns into the interlayer dielectric layer by performing an annealing process to form a photorefractive unit having a lower refractive index than the interlayer dielectric layer,
    wherein the forming of the metal wirings and the doping patterns around of the metal wirings comprises:
    forming a trench in a first interlayer dielectric layer of the interlayer dielectric layer;
    forming a doping layer over the interlayer dielectric layer including in the trench; and
    polishing the doping layer until the interlayer dielectric layer is exposed to form a first doping pattern of the doping patterns buried in the trench.

* * * * *